(12) United States Patent
Chang et al.

(10) Patent No.: US 9,529,260 B1
(45) Date of Patent: Dec. 27, 2016

(54) PHOTOSENSITIVE INSULATED RESIN COMPOSITION AND METHOD OF PRODUCING INSULATED FILM THEREOF

(71) Applicant: eChem Solutions Corp., Taoyuan (TW)

(72) Inventors: Che Wei Chang, Taoyuan (TW); Ming Che Chung, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 0 days.

(21) Appl. No.: 15/099,493

(22) Filed: Apr. 14, 2016

(30) Foreign Application Priority Data

Nov. 9, 2015 (TW) .............................. 104136881 A

(51) Int. Cl.
| | | |
|---|---|---|
| *G03F 7/023* | (2006.01) | |
| *G03F 7/40* | (2006.01) | |
| *G03F 7/022* | (2006.01) | |
| *G03F 7/038* | (2006.01) | |
| *G03F 7/16* | (2006.01) | |

(52) U.S. Cl.
CPC ............. *G03F 7/0226* (2013.01); *G03F 7/038* (2013.01); *G03F 7/168* (2013.01); *G03F 7/40* (2013.01)

(58) Field of Classification Search
CPC ........... G03F 7/0226; G03F 7/038; G03F 7/40
USPC .................................. 430/191, 192, 193, 330
See application file for complete search history.

(56) References Cited

U.S. PATENT DOCUMENTS 7,255,970 B2 * 8/2007 Toukhy .................. G03F 7/022
430/191

FOREIGN PATENT DOCUMENTS

| CN | 102227474 A | 10/2011 |
|---|---|---|
| JP | H0782961 B2 | 9/1995 |
| JP | 109227808 A | 9/1997 |
| JP | 2005121827 A | 5/2005 |
| JP | 2010051928 A | 3/2010 |

* cited by examiner

*Primary Examiner* — John S Chu
(74) *Attorney, Agent, or Firm* — Li-Jen Shen

(57) ABSTRACT

The present invention provides a photosensitive insulated resin composition and method of producing an insulated film thereof. The photosensitive insulated resin composition, which comprises the following components, can be evenly coated on a surface step of a substrate in order to form a fully covered insulate film. an alkali soluble resin containing a phenolic group; a quinone diazide-group-containing compound; a crosslinking agent; a high-boiling-point solvent having a boiling point of over or equal to 130° C.; and a low-boiling-point solvent having a boiling point of equal to or lower than 130° C., wherein a difference of the boiling points of the two high-boiling-point solvent and the low-boiling-point solvent is in a range of 30° C.~100° C., and a ratio of the high-boiling-point solvent to the low-boiling-point solvent in weight is in a range of 8:92~40:60.

16 Claims, 4 Drawing Sheets

PHOTOSENSITIVE INSULATED RESIN COMPOSITION AND METHOD OF PRODUCING INSULATED FILM THEREOF

FIELD OF THE INVENTION

The present invention is related to a photosensitive insulated resin composition applied in an interlayer cured substance (insulated film), a surface protect film (outer coated film), cured substance for packaging substrate integratedly in a semiconductor device, especially a photosensitive insulated resin composition having good properties of heat resistance, solvent resistance, and coating uniformity.

BACKGROUND OF THE INVENTION

A technique of formation of a protective film on a substrate is very important in a semiconductor manufacturing process, such as manufacture of a liquid crystal device and manufacture of an optical device. A semiconductor manufacturing process is performed under a strict and accurate controlled circumstance, for example, acid or basic condition when soaking a surface of a substrate in solution, high temperature produced partially when sputtering to form a wiring electrode film on a substrate, and thus it is necessary to form a protective film on a surface of the device or a surface of a film. Nowadays, the protective film usually includes photosensitive insulated resin material and is formed by coating, light exposing, and developing process.

The protective film requires proper surface hardness, flat and smooth texture, and adhesion property to a substrate in order to protect underlying material under a severe condition during manufacturing processes. Moreover, it is more important that a protective film must have good properties of heat resistance, solvent resistance, insulativity, mechanical characteristics, and so forth. However, a surface of an underlying substrate is usually uneven and non-planar. As shown in FIG. 1, the protective film 12 does not completely cover a surface of an element 10 because of flowability of liquid protective film 12 before curing. A oblique portion F1, a corner of the oblique portion F1 and a flat portion F2, and other portions with large elevating angle cannot be completely covered by the protective film 12, and thus it leads to damages to the material underlying during the manufacturing processes and cause qualities and efficiency worse due to the uneven thickness and incomplete coverage of the protective film 12. An uneven thickness ($\Delta t$) and incomplete coverage of the protective film 12 can be produced based on different elevating angles of oblique portions and difference turning angles of a corner. Because of an oblique portion F1 with a larger elevating angle and/or a partial surface with a sharper turning angle, a more uneven protective film 12 can be formed.

Therefore, how to solve the abovementioned problems in order to provide a protective film with good properties of heat resistance, solvent resistance, insulativity, and coating uniformity and also resulting in good pattern resolution and complete cover on a surface of a protected element/film becomes the subject of the present invention.

SUMMARY OF THE INVENTION

The present invention provides a photosensitive insulated resin composition and method of producing an insulated film thereof. The photosensitive insulated resin composition: an alkali soluble resin containing a phenolic group; a quinone diazide-group-containing compound; a crosslinking agent; a high-boiling-point solvent having a boiling point of over or equal to 130° C.; and a low-boiling-point solvent having a boiling point of equal to or lower than 130° C., wherein a difference of the boiling points of the two high-boiling-point solvent and the low-boiling-point solvent is in a range of 30° C.~100° C., and a ratio of the high-boiling-point solvent to the low-boiling-point solvent in weight is in a range of 8:92~40:60.

In one embodiment of the present invention, wherein a viscosity of the photosensitive insulated resin composition is in a range of 0.3~100 cP.

In one embodiment of the present invention, further comprising: a surfactant.

In one embodiment of the present invention, wherein the alkali soluble resin is selected from the group consisting of phenolic resin, hydroxystyrene/styrene copolymer, and a combination thereof.

In one embodiment of the present invention, wherein quinone diazide-group-containing compound is formed by reacting an alkyl-etherified amino group-containing compound with a phenolic group-containing compound.

In one embodiment of the present invention, wherein the boiling point of the low-boiling-point solvent is in a range of 40° C.~130° C.

In one embodiment of the present invention, wherein the low-boiling-point solvent is selected from the group consisting of a ketone having a carbon number of 6 or below, an ether having a carbon number of 6 or below, and a combination thereof.

In one embodiment of the present invention, wherein the boiling point of the high-boiling-point solvent is in a range of 130° C.~230° C.

In one embodiment of the present invention, wherein the high-boiling-point solvent is selected from the group consisting of propylene glycol monomethyl ether acetate, diethylene glycol ethyl methyl ether, diethylene glycol dimethyl ether, ethylene glycol monoalkyl ether acetates, propylene glycol monoalkyl ethers, propylene glycol dialkyl ethers, propylene glycol monoalkyl ether acetates, aromatic hydrocarbons, ketones having a carbon number of 6 or more, and a combination thereof.

In one embodiment of the present invention, wherein the ratio of the high-boiling-point solvent to the low-boiling-point solvent in weight is in a range of 10:90~30:70.

On the other aspect, the present invention provides a manufacturing method of an insulated film, comprising: coating the photosensitive insulated resin composition provided by the present invention onto a surface of a substrate, wherein the surface of the substrate comprises a top flat portion, a oblique portion, and a bottom flat portion, the oblique portion is a joint portion connecting the top flat portion and the bottom flat portion, and a surface step of the substrate is a straight-line distance between the top flat portion and the bottom flat portion; heating the coated substrate under a low temperature condition to form a coated film, wherein the coated film on a joint corner between the oblique portion and the top flat portion has a first thickness; patterning the coated film; and heating the coated film under a high temperature condition, wherein the coated film to form an insulated film, wherein the insulated film on the joint corner between the oblique portion and the top flat portion has a second thickness, and the second thickness is greater than 0 and smaller than the first thickness. In one embodiment of the present invention, wherein the low temperature condition is in a range of 80° C.~120° C. and a duration time of the step of heating the coated substrate is between 1 minute and 30 minutes.

In one embodiment of the present invention, wherein the high temperature condition is in a range of 180° C.~250° C. and a duration time of the step of heating the coated film is between 1 hour and 5 hours.

In one embodiment of the present invention, wherein the coating step is performed by a spray coating method.

In one embodiment of the present invention, wherein the surface step is in a range of 5~500 μm.

Accordingly, the photosensitive insulated resin composition provided by the present invention comprises at least one solvent with low boiling point and at least one solvent with high boiling point. A drying speed of the low-boiling-point solvent is faster than the high-boiling-point solvent, and thus flowing rate of the resin composition before curing is changeable. After the resin composition is evenly coated onto a substrate, the low-boiling-point solvent is firstly removed to increase viscosity of the resin composition and reduce flowability of the resin composition to form a protective film with better uniformity on the substrate. In addition, the fabricating method of an insulated film provided by the present invention can therefore result in better uniformity in thickness and coverage of the insulated film even on a substrate with an uneven surface solving problems of uneven thickness and incomplete coverage produced by the conventional composition and method. And for the photosensitive properties of the film, the film produced thereof has excellent resolution and insulativity. Therefore, the present invention can avoid problems of uneven covering thickness and incomplete coverage that produced by the conventional method.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1:
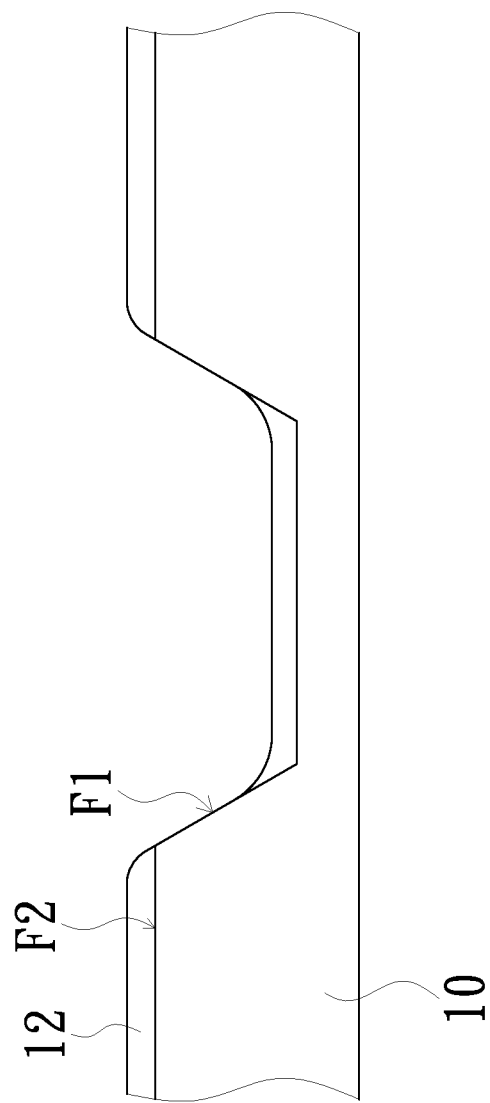
FIG. 1 is a cross-sectional view according to prior art.

The present invention provides a photosensitive insulated resin composition and method of producing an insulated film thereof. The purpose of the present invention is to more effectively form a protective film with even thickness and complete coverage on a semiconductor substrate, even on a semiconductor substrate with uneven top surface, in order to provide complete protection to the underlying substrate. According to the present invention, a protective film or an insulated film made of the photosensitive insulated resin composition has not only good coating uniformity during the coating process but also can provide good pattern resolution, heat resistance, solvent resistance and insulativity, and thus, the present invention can solve problems of uneven covering thickness and incomplete coverage that produced by the conventional method. It is to be noted that the following descriptions of individual sections regarding to photosensitive insulated resin compositions and method of producing an insulated film with preferred embodiments of this invention are presented herein for purpose of illustration and description only but not intended to be exhaustive or to be limited to the precise form disclosed.

In the following illustration, the element arranged repeatedly is described in word "one", "a" or "an" for simpler explanation. However, one skilled in the art should understand the practical structure and arrangement of each element based on the following illustration and figures provided in the present application. In addition, word "room temperature" used in the following illustration refers to temperatures in a range of 20° C.~40° C., and more specifically 20° C.~30° C.

1. Photosensitive Insulated Resin Composition

The photosensitive insulated resin composition provided by the present invention is a positive photoresist, comprising (A) an alkali soluble resin containing a phenolic group, (B) a quinone diazide-group-containing compound, (C) a crosslinking agent, (D) solvents, and optionally (E) a surfactant. The (D) solvents comprises at least one high-boiling-point solvent and at least one low-boiling-point solvent, wherein a difference of boiling points of the two solvents is in a range of 30° C.~100° C. And the photosensitive insulated resin composition provided by the present invention has a viscosity in a range of 0.3~100 cP.

(A) Alkali Soluble Resin Containing a Phenolic Group

The alkali soluble resin of the photosensitive insulated resin in the present invention is preferred to containing a phenolic group; however, the present invention is not limit as long as the resin is soluble in an alkali developing solution. The (A) phenolic-group-containing alkali soluble resin can be a phenolic resin (for example, a novolac resin), hydroxystyrene/styrene copolymer or combination thereof. For instance, the (A) phenolic-group-containing alkali soluble resin is hydroxystyrene/styrene copolymer in a preferred embodiment of the present invention. In view of reactivity, an average molecular weight/molar mass (Mw) of the (A) phenolic-group-containing alkali soluble resin of the present invention is preferred to be in a range of 2000~40000.

(B) Quinone Diazide-Group-Containing Compound

The (B) quinone diazide-group-containing compound of the photosensitive insulated resin composition in the present invention has an absorption spectrum with an active region of 200 nm~500 nm and no other else limitation is required. The (B) quinone diazide-group-containing compound is an esters compound formed by reacting alkyl-etherified amino group-containing compounds with phenolic group-containing compounds. Preferred alkyl-etherified amino group-containing compounds are 1,2-naphthoquinone diazide-4-sulfonate or 1,2-naphthoquinone diazide-5-sulfonate. For examples, (B) quinone diazide-group-containing compounds are preferably to be 2,3,4-trihydroxybenzophenone, 2,2',4,4'-tetrahydroxybenzophenone, 2,3,4,2',4'-pentahydroxybenzophenone, tris(4-hydroxyphenyl)methane, tris(4-hydroxyphenyl)ethane, 1,4-bis [1-(4-hydroxyphenyl)-1-methylethyl] benzene, and etc. The (B) quinone diazide-group-containing compound is preferably an amount of from 8 to 50 parts by weight, and more preferably an amount of from 20 to 40 parts by weight, based on 100 parts by weight of the (A) phenolic-group-containing alkali soluble resin.

(C) Crosslinking Agent

The (C) crosslinking agent of the photosensitive insulated resin composition in the present invention is selected from at least one of the followings: alkyl-etherified amino compound(s) and epoxy compound(s). The alkyl-etherified amino compound(s) described above comprises at least two alkyl-etherified amino groups, and the alkyl-etherified amino group has a chemical formula as shown in following Formula (I).

Wherein R' is an alkylene group (divalent hydrocarbon) and R" is an alkyl group. Specifically, when the alkyl-etherified amino compound(s) is selected as the (C) crosslinking agent, it is preferable to use hexamethoxymethyl melamine, hexabutoxymethyl melamine, 1,3,4,6-tetrakis(methoxymethyl)glycoluril, 1,3,4,6-tetrakis(butoxymethyl) glycoluril, or a combination thereof. The epoxy compound(s) mentioned above can be any kind of compounds as long as they contain at least one epoxy group. Specifically, when the epoxy compound(s) is selected as the (C) crosslinking agent, it is preferable to use phenolic epoxy resin, cresol novolak epoxy resin, bisphenol epoxy resin, trisphenol epoxy resin, tetraphenol epoxy resin, phenol-xylene epoxy resin, naphthol-xyleneepoxy resin, phenol-naphthol epoxy resin, phenol-dicyclopentadienyl epoxy resin, alicyclic epoxy resin, aliphatic epoxy resin, and etc. The (C) crosslinking agent is preferably an amount of from 5 to 30 parts by weight, and more preferably an amount of from 10 to 20 parts by weight, based on 100 parts by weight of the (A) phenolic-group-containing alkali soluble resin.

(D) Solvents

The (D) solvents of the photosensitive insulated resin composition in the present invention are not limited to a certain type of solvents but can dissolve the (A) phenolic-group-containing alkali soluble resin, (B) quinone diazide-group-containing compound and (C) crosslinking agent. For purposes of easy spraying/coating, reduced drying duration, and improved viscosity, the (D) solvents comprise at least one high-boiling-point solvent and at least one low-boiling-point solvent, wherein a difference of boiling points of the two solvents is in a range of 30° C.~100° C. It is preferred to use a high-boiling-point solvent with a boiling point of equal to and higher than 130° C. and a low-boiling-point solvent with a boiling point of equal to or lower than 130° C. The (D) solvents is preferably an amount of from 800 to 1200 parts by weight based on 100 parts by weight of the (A) phenolic-group-containing alkali soluble resin.

Preferably, the low-boiling-point solvent is selected from the group consisting of solvents having boiling points in a range of 40° C.~130° C., ketones having a carbon number of 6 or below, ethers having a carbon number of 6 or below, and a combination thereof. In preferred embodiments, the ketones are selected from acetone, butanone and methyl isobutyl ketone, and the ethers are selected from, for examples, methyl propyl ether, methyl butyl ether and diethylene glycol ethyl methyl ether. A viscosity of the photosensitive insulated resin composition after spraying increases leading to a flow rate of the resin composition decreasing because the low-boiling-point solvent has a faster drying rate.

Preferably, the high-boiling-point solvent is selected from the group consisting of solvents having a boiling point in a range of 130° C.~230° C., which may includes propylene glycol monomethyl ether acetate (PGMEA), diethylene glycol ethyl methyl ether, diethylene glycol dimethyl ether, ethylene glycol monoalkyl ether acetates (for instances, ethylene glycol monomethyl ether acetate (EGMEA), ethylene glycol monoethyl ether acetate and etc.), propylene glycol monoalkyl ethers (for instances, propylene glycol monomethyl ether, propylene glycol monoethyl ether, propylene glycol monopropyl ether, propylene glycol monobutyl ether and etc.), propylene glycol dialkyl ethers (for instances, propyleneglycol dimethyl ether, propyleneglycol diethyl ether, propyleneglycol dipropyl ether, propyleneglycol dibutyl ether and etc.), propylene glycol monoalkyl ether acetates (for instances, propylene glycol monomethyl ether acetate, propylene glycol monoethyl ether acetate, propylene glycol monopropyl ether acetate, propylene glycol monobutyl ether acetate and etc.), aromatic hydrocarbons (such as toluene, xylene, and etc.), ketones having a carbon number of 6 or more (such as 2-heptanone, 3-heptanone, 4-heptanone, cyclohexanone and etc.), and a combination thereof. The high-boiling-point solvent can make the photosensitive insulated resin composition evenly and uniformly covering the surface of the substrate after spraying before curing during the coating process by reducing flowability of the resin composition.

As for a weight ratio between the high-boiling-point solvent and the low-boiling-point solvent, a ratio of high-boiling-point solvent to the low-boiling-point solvent in weight is preferably in a range of 8:92~40:60, and more preferably in a range of 10:90~30:70. The photosensitive insulated resin composition is not viscous (or creamy/sticky) enough and has poor coating ability to the substrate if the low-boiling-point solvent is less than 60 wt % to the (D) solvents (all solvents including low-boiling-point solvent and high-boiling-point solvent); and on the other hands, the photosensitive insulated resin composition cannot evenly and uniformly cover the surface of the substrate if the low-boiling-point solvent is greater than 92 wt % to the (D) solvents due to too high flowability of the resin composition.

(E) Surfactant

In order to avoid problems of uneven coverage and unsmooth surface (i.e. Bénard Cells) formed after coating and baking (or drying) process, the photosensitive insulated resin composition provided by the present optionally comprises (E) a surfactant. The (E) surfactant is preferably selected from fluorine, siloxane, and nonionic surfactants. The (E) surfactant is preferably an amount of from 0.01 to 1 part by weight, and more preferably an amount of from 0.01 to 0.1 parts by weight, based on 100 parts by weight of the (A) phenolic-group-containing alkali soluble resin.

The photosensitive insulated resin composition provided by the present invention can comprise additives other than abovementioned (A)~(E) and it is still within the spirit and scope of the present invention. The photosensitive insulated resin composition provided by the present invention can also comprise, but not limited to, adhesion assistant, foam inhibiting agent, leveling agent, sensitizer, and/or inorganic stuffer depending on different needs. The additives are preferably in a total amount of less than 1 part by weight based on 100 parts by weight of the total solid content of the photosensitive insulated resin composition.

2. Method of Producing Insulated Film

Figure 2:
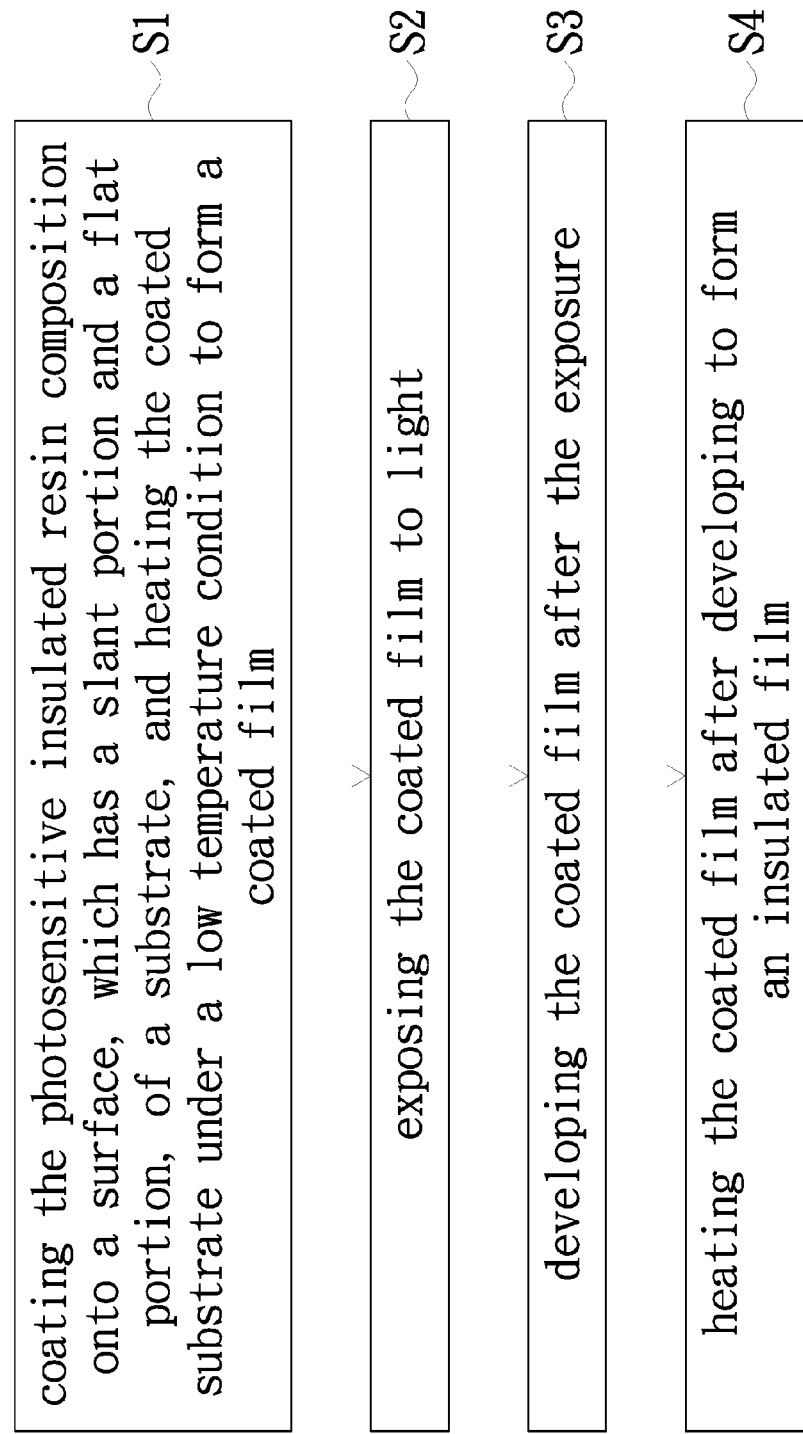
FIG. 2 is a schematic diagram of steps of the method of producing an insulated film provided by the present invention.

As shown in FIG. 2 illustrating fabricating steps of an insulated film, the method comprises: (S1) coating the photosensitive insulated resin composition provided by the present invention onto a surface of a substrate, which has a oblique portion and a flat portion, of a substrate, and heating the coated substrate under a low temperature condition to form a coated film; (S2) exposing the coated film to light; (S3) developing the coated film after the exposure; and (S4) heating the coated film after developing to form an insulated film.

Specifically, in the step (S1), the photosensitive insulated resin composition provided by the present invention is coated onto the substrate under the low temperature condition in a range of 80° C.~120° C. for a duration time between 1 minute and 30 minutes in order to form the coated film having a thickness in a range of 20 μm~50 μm. Preferably, the coated film is coated onto the substrate by spraying coating method via a spray nozzle. The material of the substrate is not limited, for example, the substrate can be a silicon wafer, a sapphire substrate, or an aluminum substrate (or called ALPCB for short). The step (S1) is illustrated below according with FIG. 2a.

Figure 2A:
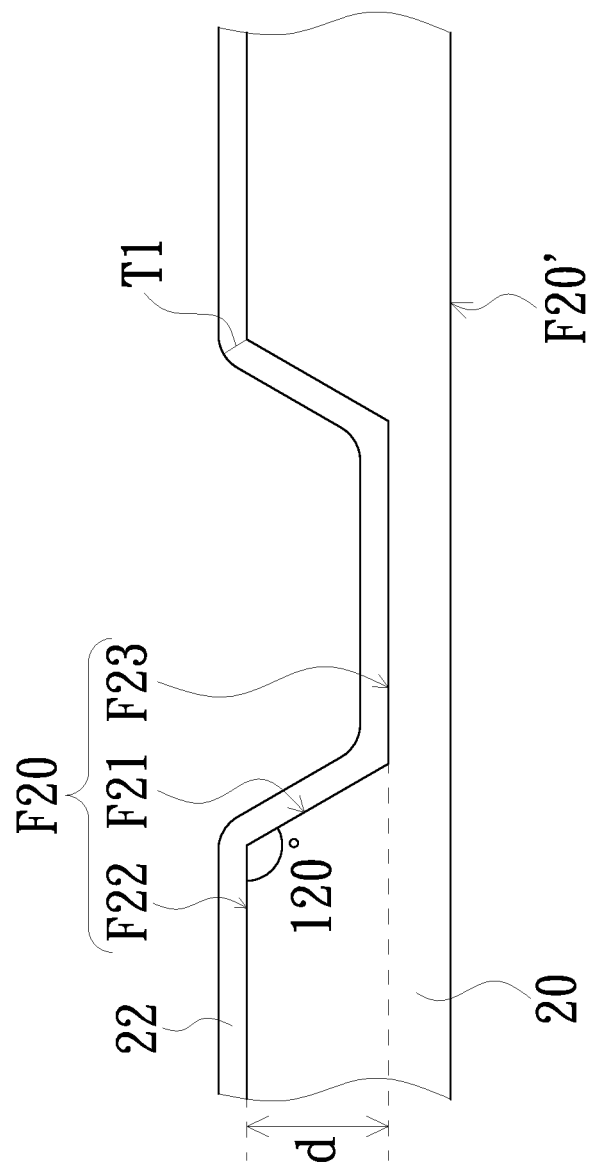
FIG. 2a is a cross-sectional view according to the step (S1) of the present invention.

FIG. 2a is a cross-sectional view according to the step (S1) of the present invention. As shown in FIG. 2a, a top surface F20 of the substrate 20 includes at least a top flat portion F22, a oblique portion F21, and a bottom flat portion F23, wherein the oblique portion F21 is a connecting portion between the top flat portion F22 and the bottom flat portion F23, and a surface step d of the top surface F20 is the shortest/straight-line distance between the top flat portion F22 and the bottom flat portion F23, in other words, the surface step d of the top surface F20 is a distance difference between a vertical distance from the top flat portion F22 to a bottom surface F20' and a vertical distance from the bottom flat portion F23 to the bottom surface F20'. For easier understanding, the following description continue to use FIG. 2a and the same element numbers therein for illustration only but not intend to limit the present invention. According to an embodiment of the present invention, the step (S1) is to spraying coating the photosensitive insulated resin composition provided by the present invention onto a 6 inches substrate 20 having the surface step d in a range of 5~500 μm. An angle between the top flat portion F22 and the oblique portion F21 is 120° under the low temperature condition of 100° C. heating for 5 minutes in order to evaporate most of the low-boiling-point solvents to form the coated film 22 having a thickness about 20 μm. A thickness of the coated film on the joint corner between the oblique portion F21 and the top flat portion F22 of the substrate 20 is measured and marked as T1 (μm).

Then in the step (S2), the light exposure is performed on the coated film formed in the step (S1) by a patterned mask. Radiation used in the exposure includes X-ray and ultraviolet ray, and radiation sources can be, for example, low-pressure mercury vapor lamp, high-pressure mercury vapor lamp, metal halide lamp, g-line stepper, h-line stepper, i-line stepper, KrF stepper, and so on.

Next in the step (S3), exposed portions of the coated film by the patterned mask is dissolved and removed by alkali developing solution in order to form a patterned coated film. The developing solution can be applied to the coated film by, for example, shower spraying, spray coating, soaking, and etc. In an embodiment of the present invention, the development is performed under a room temperature within 5 minutes and then the substrate is washed by water.

Afterward, the step (S4) is performed to heat the remaining coated film under a high temperature condition in a range of 180° C.~250° C. for a duration in a range of 1~5 hours to form the insulated film. For example, in an embodiment of the present invention, the insulated film is formed by baking the coated film on the substrate in an oven under a temperature in a range 180° C.~250° C. The step (S4) is illustrated below as shown in FIG. 2b according to the embodiment same as described in the step (S3).

Figure 2B:
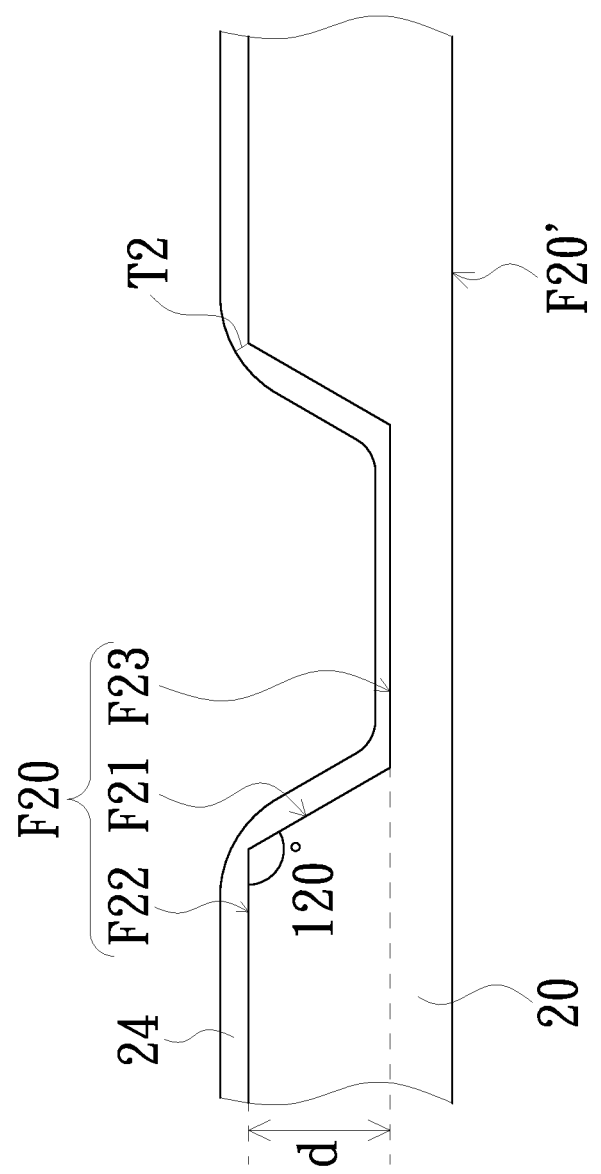
FIG. 2b is a cross-sectional view according to the step (S4) of the present invention.

FIG. 2b is a cross-sectional view according to the step (S4) of the present invention. For easier illustration, only a part of the substrate 20 is shown in FIG. 2b (the pattern of the patterned coated film is not shown). As shown in FIG. 2b, after the step (S2) and (S3), the patterned coated film formed after the step (S3) is baked under a temperature of 230° C. for about an hour in order to cure the patterned coated film to and thus to form the insulated film 24. A thickness of insulated film 24 on the joint corner between the oblique portion F21 and the top flat portion F22 of the substrate 20 is measured and marked as T2 (μm), wherein the T1 and T2 have a relationship that 0<T2<T1 (μm), and preferably 2<T2<T1 (μm) as for better insulativity.

Because the photosensitive insulated resin composition comprises at least one high-boiling-point solvent and at least one low-boiling-point solvent, the two steps of heating process as illustrated in the step (S1) and (S4) is performed in order to improve evenness of thickness and completeness of coverage on the surface of the substrate. The low-boiling-point solvent can improve coating ability and coverage completeness during the coating process in the step (S1). Thus, the low-boiling-point solvent is removed by low temperature heating in the step (S1) after coating in order to reduce flowability of the resin composition while remain coverage completeness. Even some amount of the high-boiling-point is possibly removed in the step (S1), both duration time and temperature of the heating process can be adjusted for good coverage completeness. In addition, even though the substrate 20 illustrated in the embodiment above shows the top flat portion F22 having an angle of 120° relative to the oblique portion F21, it is for illustration only but not to limit the present. The photosensitive insulated resin composition and the insulated film fabricating method thereof can be applied on a substrate having different angles other than 120°.

Different embodiments are provided below in order to illustrate the present invention more clearly. However, it is not attend to limit the present invention. In the following description, the same English letter represents the same group of components as described in the section of "1. Photosensitive Insulated Resin Composition", and the same number represents the same chemical in the group used in the embodiments.

According to the first embodiment of the present invention, the photosensitive insulated resin composition comprises (A1) 100 parts by weight of phenolic resin (a mole ration of m-cresol to p-cresol=5:5, Mw: 8000); (B1) 30 parts by weight of condensates of 4,4'-[1-[4-[1-(4-hydroxypheny)-1-methylethyl]phenyl]ethylidene]bis(phenol) and 1,2-naphthoquinone diazide-5-sulfonate; (C1) 20 parts by weight of hexamethoxymethylmelamine; (E1) 0.05 parts by weight of fluoride-containing surfactant (model number of F-554 produced by DIC); (D1) 900 parts by weight of acetone; and (D2) 120 parts by weight of propylene glycol monomethyl ether acetate. The photosensitive insulated resin composition is formed by dissolving (A1), (B1), (C1), (E1) into (D1) and (D2) (no particular order).

According to the second embodiment of the present invention, the photosensitive insulated resin composition comprises (A2) 80 parts by weight of phenolic resin (a mole ration of m-cresol to p-cresol=6:4, Mw: 8000); (A3) 20 parts by weight of poly(p-hydromethylstyrene) (Mw: 20000); (B1) 30 parts by weight of condensates of 4,4'-[1-[4-[1-(4-hydroxypheny)-1-methylethyl]phenyl]ethylidene]bis(phenol) and 1,2-naphthoquinone diazide-5-sulfonate; (C1) 20 parts by weight of hexamethoxymethylmelamine; (E1) 0.05 parts by weight of fluoride-containing surfactant (model number of F-554 produced by DIC); (D1) 900 parts by weight of acetone; and (D3) 120 parts by weight of diethylene glycol ethyl methyl ether. The photosensitive insulated resin composition is formed by dissolving (A2), (A3), (B1), (C1), (E1) into (D1) and (D3) (no particular order).

According to the third embodiment of the present invention, the photosensitive insulated resin composition comprises (A4) 100 parts by weight of polymer of p-hydroxystyrene/styrene (a mole ration of p-hydroxystyrene to styrene=9:1, Mw: 40000); (B1) 30 parts by weight of condensates of 4,4'-[1-[4-[1-(4-hydroxypheny)-1-methyl-ethyl]phenyl]ethylidene]bis(phenol) and 1,2-naphthoquinone diazide-5-sulfonate; (C1) 20 parts by weight of hexamethoxymethylmelamine; (E1) 0.05 parts by weight of fluoride-containing surfactant (model number of F-554 produced by DIC); (D4) 900 parts by weight of butanone; and (D3) 120 parts by weight of diethylene glycol ethyl methyl ether. The photosensitive insulated resin composition is formed by dissolving (A4), (B1), (C1), (E1) into (D4) and (D3) (no particular order).

According to the fourth embodiment of the present invention, the photosensitive insulated resin composition comprises (A4) 100 parts by weight of polymer of p-hydroxystyrene/styrene (a mole ration of p-hydroxystyrene to styrene=9:1, Mw: 40000); (B2) 30 parts by weight of condensates of 4,4'-[1-[4-[1-(4-hydroxypheny)-1-methyl-ethyl]phenyl]ethylidene]bis(phenol) and 1,2-naphthoquinone diazide-4-sulfonate; (C1) 20 parts by weight of hexamethoxymethylmelamine; (E1) 0.05 parts by weight of fluoride-containing surfactant (model number of F-554 produced by DIC); (D4) 900 parts by weight of butanone; and (D3) 120 parts by weight of diethylene glycol ethyl methyl ether. The photosensitive insulated resin composition is formed by dissolving (A4), (B2), (C1), (E1) into (D4) and (D3) (no particular order).

According to the fifth embodiment of the present invention, the photosensitive insulated resin composition comprises (A4) 100 parts by weight of polymer of p-hydroxystyrene/styrene (a mole ration of p-hydroxystyrene to styrene=9:1, Mw: 40000); (B2) 30 parts by weight of condensates of 4,4'-[1-[4-[1-(4-hydroxypheny)-1-methyl-ethyl]phenyl]ethylidene]bis(phenol) and 1,2-naphthoquinone diazide-4-sulfonate; (C1) 20 parts by weight of hexamethoxymethylmelamine; (D4) 900 parts by weight of butanone; and (D3) 120 parts by weight of diethylene glycol ethyl methyl ether. The photosensitive insulated resin composition is formed by dissolving (A4), (B2), (C1) into (D4) and (D3) (no particular order).

In order to clearly illustrate improved results of the present invention, it provides three comparative examples in the following to compare with the five embodiments above. The comparing methods and results are provided in the section "3. Evaluation of the Photosensitive Insulated Resin Compositions". Compositions of the three comparative examples are provided below, wherein the first comparative example involves only high-boiling-point solvent and no low-boiling-point solvent; the second comparative example lacks (C) crosslinking agent; and the third comparative example includes components (A) to (D) but with a weight ratio of the high-boiling-point solvent to the low-boiling-point solvent equal to 1:1, which is outside the preferred range of 8:92~40:60 as provided above. Moreover, practically an insulated film is unable to be formed on a substrate if without the high-boiling-point solvent as defined above but only components (A)-(C) and low-boiling-point solvent. Thus, results of an example including only components (A)-(C) and low-boiling-point solvent are not provided.

According to the first comparative example, the photosensitive insulated resin composition comprises (A4) 100 parts by weight of polymer of p-hydroxystyrene/styrene (a mole ration of p-hydroxystyrene to styrene=9:1, Mw: 40000); (B1) 30 parts by weight of condensates of 4,4'-[1-[4-[1-(4-hydroxypheny)-1-methylethyl]phenyl]ethylidene] bis(phenol) and 1,2-naphthoquinone diazide-5-sulfonate; (C1) 20 parts by weight of hexamethoxymethylmelamine; and (D2) 1000 parts by weight of propylene glycol monomethyl ether acetate. The photosensitive insulated resin composition is formed by dissolving (A4), (B2), and (C1) into (D2) (no particular order). A major difference between the first comparative example and the present invention is that the first comparative example involves only high-boiling-point solvent and no low-boiling-point solvent.

According to the second comparative example, the photosensitive insulated resin composition comprises (A2) 100 parts by weight of phenolic resin (a mole ration of m-cresol to p-cresol=6:4, Mw: 8000); (B1) 30 parts by weight of condensates of 4,4'-[1-[4-[1-(4-hydroxypheny)-1-methyl-ethyl]phenyl]ethylidene]bis(phenol) and 1,2-naphthoquinone diazide-5-sulfonate; (D1) 900 parts by weight of acetone; and (D3) 120 parts by weight of diethylene glycol ethyl methyl ether. The photosensitive insulated resin composition is formed by dissolving (A2), (B1) into (D1) and (D3) (no particular order). A major difference between the second comparative example and the present invention is that the second comparative example lacks (C) crosslinking agent.

According to the third comparative example, the photosensitive insulated resin composition comprises (A4) 100 parts by weight of polymer of p-hydroxystyrene/styrene (a mole ration of p-hydroxystyrene to styrene=9:1, Mw: 40000); (B1) 30 parts by weight of condensates of 4,4'-[1-[4-[1-(4-hydroxypheny)-1-methylethyl]phenyl]ethylidene] bis(phenol) and 1,2-naphthoquinone diazide-5-sulfonate; (C1) 20 parts by weight of hexamethoxymethylmelamine; (D4) 300 parts by weight of butanone; and (D3) 300 parts by weight of diethylene glycol ethyl methyl ether. The photosensitive insulated resin composition is formed by dissolving (A4), (B1), and (C1) into (S4) and (D3) (no particular order). A major difference between the third comparative example and the present invention is that the third example has a ratio of high-boiling-point solvent to the low-boiling-point solvent equal to 1:1, which is outside the preferred range of 8:92~40:60 of the present invention.

3. Evaluation of the Photosensitive Insulated Resin Compositions

The first to fifth embodiments and the first to third comparative examples are tested by the following methods subjected to coating ability, heat resistance, solvent resistance, insulativity, and resolution. The results are shown in Table 1 as follows.

(1) Coating Ability and Heat Resistance

The resin composition is coated onto a substrate, wherein the substrate is a six inches wafer and has the surface step d of the top surface of the substrate (please refer to the surface step d above) of 100 μm. Then the substrate is heated under a temperature condition of 100° C. for 5 minutes to form a coated film with a thickness about 20 μm. A thickness of the coated film on the joint corner between the oblique portion and the top flat portion of the substrate is measured and marked as T1 (μm). Afterward, the substrate is baked under a temperature condition of 230° C. in a convection oven for an hour to cure the coated film to form an insulated film. A thickness of the insulated film on the joint corner between the oblique portion and the top flat portion of the substrate is measured and marked as T2 (μm), and thus a ratio of T2/T1 is calculated in percentage (%), as shown in Table 1. Wherein larger the ratio of T2/T1 is, smaller a change rate of the film before and after drying is; and therefore, the insulated film formed thereof can have better coating ability, covering evenness, covering completeness, and heat resistance. The resin compositions from the five embodiments and the three examples are all tested following the same way.

(2) Solvent Resistance

The resin composition is coated onto a six inches wafer, and then the substrate is heated under a temperature condition of 100° C. for 5 minutes to form a coated film with a thickness about 20 μm. The substrate is next baked under a temperature condition of 230° C. in a convection oven for an hour to cure the coated film to form an insulated film. Afterward, the substrate is soaked in acetone for 10 minutes. Then it is to use an optical microscope to observe the surface of the insulated film if it is cracked or not. The resin compositions from the five embodiments and the three examples are all tested following the same way. As shown in Table 1, ○ means no cracks observed, and x means cracks observed.

(3) Insulativity

The resin composition is coated onto a six inches wafer having the surface step d of 100 μm, and then the substrate is heated on a heating plate with 100° C. for 5 minutes to form a coated film with a thickness about 20 μm. The substrate is next baked under a temperature condition of 230° C. in a conventional oven for an hour to cure the coated film to form an insulated film. Afterward, a volume resistivity of the insulated film is tested by a 4339B high-resistance meter (produced by Agilent). The resin compositions from the five embodiments and the three examples are all tested following the same way, and results are shown in Table 1.

(4) Resolution

The resin composition is coated onto a six inches wafer having the surface step d of 100 μm, and then the substrate is heated under a temperature condition of 100° C. for 5 minutes to form a coated film with a thickness about 20 μm. Next an exposure process is performed using an i-line stepper produced by Nikon (NA is 0.63), and a development is performed using 2.38% of tetramethyl ammonium as developing solution to form a patterned coated film. The pattern of the patterned coated film is observed under an optical microscope. The resin compositions from the five embodiments and the three examples are all tested following the same way, and results are shown in Table 1.

TABLE 1

|  | T2/T1 (%) | Solvent Resistance | Insulativity (Ω) | Resolution (μm) |
|---|---|---|---|---|
| Embodiment 1 | 78% | ○ | $3 \times 10^{15}$ | 12 |
| Embodiment 2 | 72% | ○ | $1 \times 10^{15}$ | 14 |
| Embodiment 3 | 74% | ○ | $1 \times 10^{15}$ | 12 |
| Embodiment 4 | 76% | ○ | $3 \times 10^{15}$ | 12 |
| Embodiment 5 | 76% | ○ | $2 \times 10^{15}$ | 12 |
| Comparative Example 1 | 0% | ○ | — | — |
| Comparative Example 2 | 24% | X | $1 \times 10^{15}$ | 14 |
| Comparative Example 3 | 65% | ○ | $2 \times 10^{15}$ | 30 |

As shown in Table 1, T2/T1 ratios of the Embodiments 1-5 are all above 70%, and testing results of the Embodiments 1-5 on solvent resistance, insulativity and resolution are better than Comparative Examples 1-3, individually or in average. On the other hand, the Comparative Example 1 involves only high-boiling-point solvent and no low-boiling-point solvent fail to reduce flowing rate of the resin composition leading to difficulties of spraying. And thus, oblique portions with larger angles relative to bottom flat portion of the substrate cannot be covered completely, and the insulativity and resolution are unable to measure due to incomplete coverage. The Comparative Example 2 lacks (C) crosslinking agent, and thus, bonding ability between molecules are poor. Therefore, the results on coating ability, heat resistance, and solvent resistance are poor due to poor bonding ability. And last, the Comparative Example 3 has a weight ratio of high-boiling-point solvent to the low-boiling-point solvent equal to 1:1, which is outside the preferred range of 8:92~40:60 of the present invention. The T2/T1 ratio (i.e. coating ability and heat resistance) is lower than 70%, which is worse than all Embodiments 1-5, due to too less amount of the low-boiling-point solvent.

The present invention provides a photosensitive insulated resin composition comprises at least one high-boiling-point solvent and at least one low-boiling-point solvent having a weight ratio of the two solvents in a certain range, and thus it can have good evenness of thickness of the film as after spraying before drying, good reactivity during the heating process, and excellent solvent resistance of the film formed thereof. Even the resin composition is applied on a non-planar top surface of a substrate, an insulated film with even thickness, complete coverage and good insulativity can be formed due to reducing flowability of the resin composition during the fabricating process. Moreover, the insulated film using the photosensitive insulated resin composition following the method provided by the present invention has abovementioned characteristics and also excellent insulativity and resolution.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A photosensitive insulated resin composition, comprising:
    an alkali soluble resin containing a phenolic group;
    a quinone diazide-group-containing compound;
    a crosslinking agent;
    a high-boiling-point solvent having a boiling point of over or equal to 130° C.; and
    a low-boiling-point solvent having a boiling point of equal to or lower than 130° C., wherein a difference of the boiling points of the two high-boiling-point solvent and the low-boiling-point solvent is in a range of 30° C.~100° C., and a ratio of the high-boiling-point solvent to the low-boiling-point solvent in weight is in a range of 8:92~40:60.

2. The photosensitive insulated resin composition according to claim 1, wherein a viscosity of the photosensitive insulated resin composition is in a range of 0.3~100 cP.

3. The photosensitive insulated resin composition according to claim 1, further comprising: a surfactant.

4. The photosensitive insulated resin composition according to claim 1, wherein the alkali soluble resin is selected from the group consisting of phenolic resin, hydroxystyrene/styrene copolymer, and a combination thereof.

5. The photosensitive insulated resin composition according to claim 1, wherein quinone diazide-group-containing compound is formed by reacting an alkyl-etherified amino group-containing compound with a phenolic group-containing compound.

6. The photosensitive insulated resin composition according to claim 1, wherein the boiling point of the low-boiling-point solvent is in a range of 40° C.~130° C.

7. The photosensitive insulated resin composition according to claim 6, wherein the low-boiling-point solvent is selected from the group consisting of a ketone having a carbon number of 6 or below, an ether having a carbon number of 6 or below, and a combination thereof.

8. The photosensitive insulated resin composition according to claim 1, wherein the boiling point of the high-boiling-point solvent is in a range of 130° C.~230° C.

9. The photosensitive insulated resin composition according to claim 1, wherein the high-boiling-point solvent is selected from the group consisting of propylene glycol monomethyl ether acetate, diethylene glycol ethyl methyl ether, diethylene glycol dimethyl ether, ethylene glycol monoalkyl ether acetates, propylene glycol monoalkyl ethers, propylene glycol dialkyl ethers, propylene glycol monoalkyl ether acetates, aromatic hydrocarbons, ketones having a carbon number of 6 or more, and a combination thereof.

10. The photosensitive insulated resin composition according to claim 1, wherein the ratio of the high-boiling-point solvent to the low-boiling-point solvent in weight is in a range of 10:90~30:70.

11. A method of producing an insulated film, comprises:
coating the photosensitive insulated resin composition according to claim 1 onto a surface of a substrate, wherein the surface of the substrate comprises a top flat portion, an oblique portion, and a bottom flat portion, the oblique portion is a joint portion connecting the top flat portion and the bottom flat portion, and a surface step of the substrate is a straight-line distance between the top flat portion and the bottom flat portion;
heating the coated substrate under a low temperature condition to form a coated film, wherein the coated film on a joint corner between the oblique portion and the top flat portion has a first thickness;
patterning the coated film; and
heating the coated film under a high temperature condition, wherein the coated film forms an insulated film, wherein the insulated film on the joint corner between the oblique portion and the top flat portion has a second thickness, and the second thickness is greater than 0 and smaller than the first thickness.

12. The method of producing an insulated film according to claim 11, wherein the low temperature condition is in a range of 80° C.~120° C. and a duration time of the step of heating the coated substrate is between 1 minute and 30 minutes.

13. The method of producing an insulated film according to claim 11, wherein the high temperature condition is in a range of 180° C.~250° C. and a duration time of the step of heating the coated film is between 1 hour and 5 hours.

14. The method of producing an insulated film according to claim 11, wherein the coating step is performed by a spray coating method.

15. The method of producing an insulated film according to claim 11, wherein the surface step is in a range of 5~500 μm.

16. The method of producing an insulated film according to claim 11, wherein the first thickness and the second thickness are both measured in μm, and the second thickness is greater than 2.

* * * * *